US011378594B2

(12) United States Patent
Djogo

(10) Patent No.: US 11,378,594 B2
(45) Date of Patent: Jul. 5, 2022

(54) CAPACITIVE VOLTAGE SENSOR WITH HIDDEN SENSING ELECTRODE

(71) Applicant: S&C Electric Company, Chicago, IL (US)

(72) Inventor: Goran Djogo, Mount Prospect, IL (US)

(73) Assignee: S&C Electric Company, Chicago, IL (US)

( * ) Notice: Subject to any disclaimer, the term of this patent is extended or adjusted under 35 U.S.C. 154(b) by 369 days.

(21) Appl. No.: 16/705,080

(22) Filed: Dec. 5, 2019

(65) Prior Publication Data

US 2020/0191832 A1 Jun. 18, 2020

Related U.S. Application Data

(60) Provisional application No. 62/778,477, filed on Dec. 12, 2018.

(51) Int. Cl.

| | |
|---|---|
| ***G01N 27/02*** | (2006.01) |
| ***G01R 15/14*** | (2006.01) |
| ***H01H 33/02*** | (2006.01) |
| *G01R 15/04* | (2006.01) |

(52) U.S. Cl.

CPC ......... *G01R 15/144* (2013.01); *H01H 33/027* (2013.01); *G01R 15/04* (2013.01)

(58) Field of Classification Search

CPC ........ G01R 15/04; G01R 15/06; G01R 15/16; G01R 15/14; G01R 15/142; G01R 15/144; G01R 27/32; G01N 27/221

See application file for complete search history.

(56) References Cited

U.S. PATENT DOCUMENTS

| | | | | |
|---|---|---|---|---|
| 2013/0099773 | A1* | 4/2013 | Wildermuth | G01R 19/0046 324/96 |
| 2016/0139181 | A1* | 5/2016 | Gravermann | G01R 31/58 324/686 |
| 2017/0038414 | A1* | 2/2017 | Barba Jimenez | G01R 19/0084 |
| 2017/0227582 | A1* | 8/2017 | Iida | G01R 19/175 |
| 2019/0302149 | A1* | 10/2019 | Kerr | G01R 15/06 |

* cited by examiner

*Primary Examiner* — Thang X Le

(57) ABSTRACT

A capacitive voltage sensor that has particular application to be molded into an insulating body of a switch. The voltage sensor includes an annular electrode assembly having a grounded electrode including an inner ring and an outer ring defining a space therebetween, and a sensing electrode positioned in the space and being substantially surrounded by the inner and outer rings. The body is formed around the electrode assembly and a cylindrical center conductor extends through the electrode assembly. Capacitive coupling is provided between the sensing electrode and the center conductor by one or more openings in the inner ring, such as a single round hole, a slot or a plurality of symmetrically disposed round holes or slots. The inner and outer rings can be attached at one end so that the grounded electrode is a single piece or the rings can be separate rings electrically coupled together by conductive screws.

20 Claims, 8 Drawing Sheets

FIG - 13
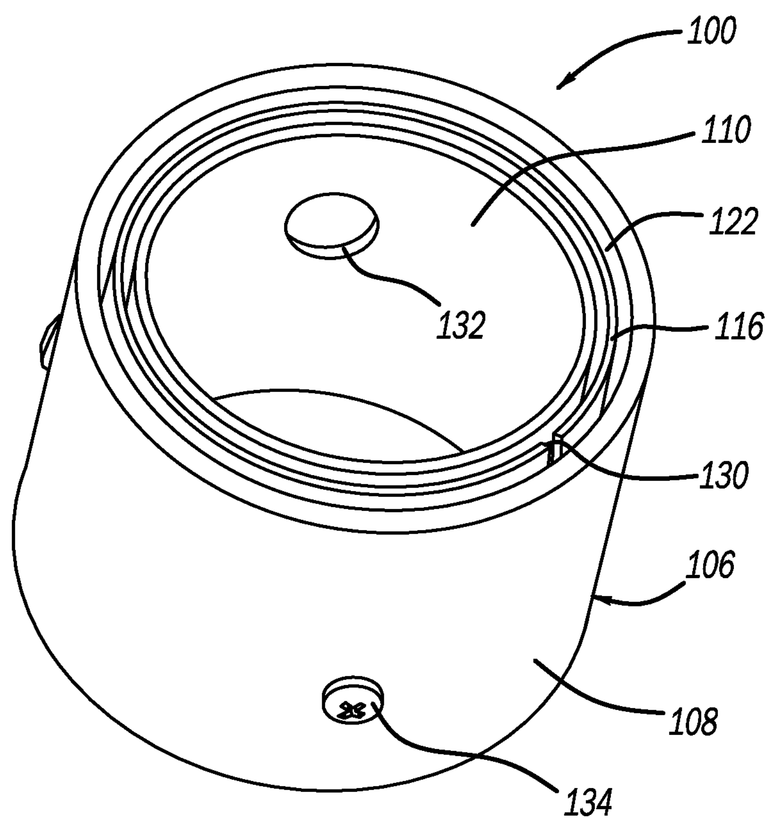
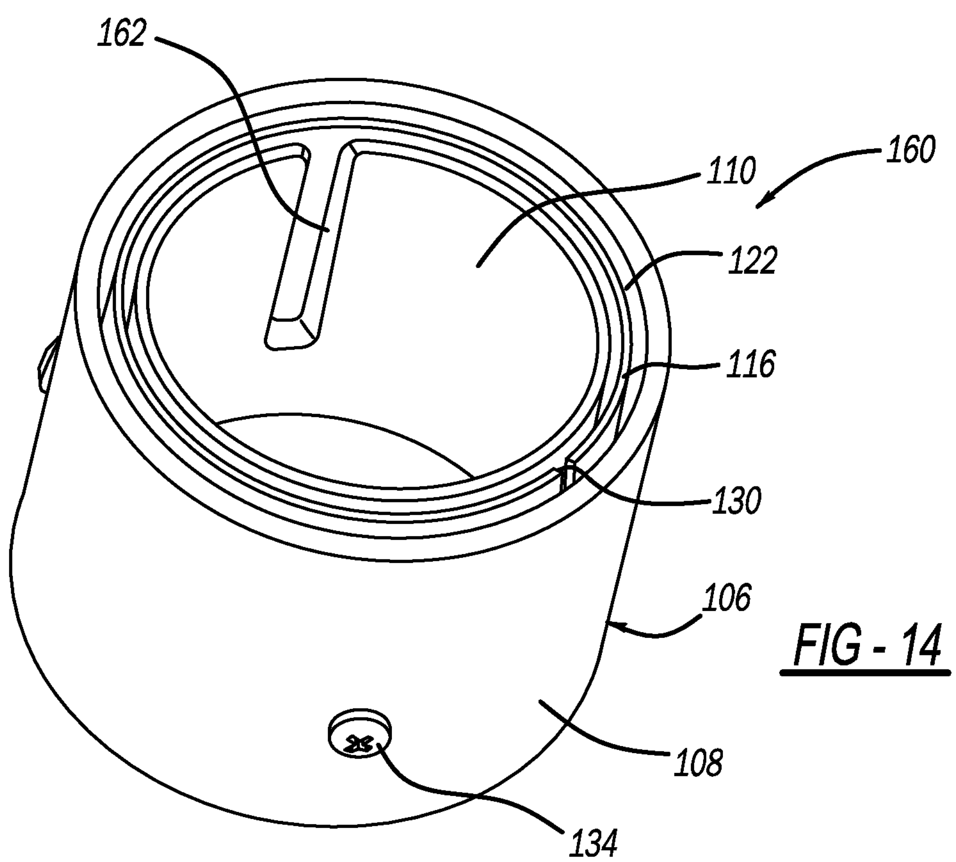
FIG - 14

CAPACITIVE VOLTAGE SENSOR WITH HIDDEN SENSING ELECTRODE

CROSS-REFERENCE TO RELATED APPLICATION

This application claims the benefit of priority from the U.S. Provisional Application No. 62/778,477, filed on Dec. 12, 2018, the disclosure of which is hereby expressly incorporated herein by reference for all purposes.

BACKGROUND

Field

This disclosure relates generally to a capacitive voltage sensor and, more particularly, to a capacitive voltage sensor including an electrode assembly having a grounded electrode surrounding a hidden sensing electrode, where the electrode assembly is molded within an insulating body of a switch.

Discussion of the Related Art

An electrical power distribution network, often referred to as an electrical grid, typically includes a number of power generation plants each having a number of power generators, such as gas turbine engines, nuclear reactors, coal-fired generators, hydro-electric dams, etc. The power plants provide a high voltage AC signal on high voltage transmission lines that deliver electrical power to a number of substations typically located within a community, where the voltage is stepped down to a medium voltage. The substations provide the medium voltage power to a number of three-phase feeder lines. The feeder lines are coupled to a number of lateral lines that provide the medium voltage to various transformers, where the voltage is stepped down to a low voltage and is provided to a number of loads, such as homes, businesses, etc.

Power distribution networks of the type referred to above include a number of switching devices, breakers, reclosers, interrupters, etc. that control the flow of power throughout the network. Some of these components are enclosed in a number of external housings that are mounted on, for example, a concrete pad, or mounted underground, and are generally referred to herein as switchgear. The number and type of switchgear are application specific to the particular power network.

Voltage sensors are often employed in these types of switchgear. For example, it is known to employ a voltage sensor on a source side of the switch in a switchgear and on a load side of the switch so as to provide pulse closing control of the switch for clearing faults. Some of these switches, such as vacuum fault interrupter switches, employ solid insulation housings, where it is known to mold voltage sensor electrodes in the housing at a location close to a grounded surface. These types of voltage sensors operate as a capacitive voltage divider, where the same insulation material is used for both the high and low voltage capacitor layers in order to achieve good accuracy over a specified range of operating temperatures. However, a high dielectric field in the low voltage capacitor layer causes an increased probability of dielectric breakdown when there are molding defects within the low voltage capacitor layer.

SUMMARY

The following discussion discloses and describes a capacitive voltage sensor that has particular application in a high or medium voltage switch with a molded solid insulation. In one embodiment, the capacitive voltage sensor includes an annular electrode assembly having a grounded electrode including an inner ring and an outer grounded ring defining a space therebetween, and a sensing electrode positioned in the space and being substantially surrounded by the inner and outer grounded rings. A solid insulation body is molded around the electrode assembly and a cylindrical center conductor extends through the electrode assembly. Capacitive coupling is provided between the sensing electrode and the center conductor by one or more openings in the inner grounded ring, such as a single round hole, a slot or a plurality of symmetrically disposed round holes or slots. The inner and outer grounded rings can have one common end so that the grounded electrode is a single piece or the inner and outer rings can be separate rings electrically coupled together by conductive screws.

In another embodiment, the capacitive voltage sensor includes an annular electrode assembly having a plurality of spaced apart grounded electrodes and a plurality of spaced apart sensing electrodes, where the grounded electrodes and the sensing electrodes are configured in an alternating pattern and where the grounded electrodes are electrically coupled together and the sensing electrodes are electrically coupled together. A solid insulation body is molded around the electrode assembly and a cylindrical center conductor extends through the electrode assembly, where the insulating body forms a plurality of insulating layers between the grounded electrodes and the sensing electrodes.

Additional features of the disclosure will become apparent from the following description and appended claims, taken in conjunction with the accompanying drawings.

BRIEF DESCRIPTION OF THE DRAWINGS

FIG. 13 is an isometric view of an electrode assembly separated from the voltage sensor shown in FIG. 7, where the opening in the inner grounded electrode is a rounded hole;

FIG. 14 is an isometric view of an electrode assembly that can replace the electrode assembly shown in FIG. 13, where the opening in the inner grounded electrode is a slot;

DETAILED DESCRIPTION OF THE EMBODIMENTS

The following discussion of the embodiments of the disclosure directed to a capacitive voltage sensor including an electrode assembly having a grounded electrode surrounding a hidden sensing electrode, where the electrode assembly is molded within a molded insulation body of a switch is merely exemplary in nature, and is in no way intended to limit the invention or its applications or uses. For example, the discussion herein describes a voltage sensor employed in connection with switchgear. However, the voltage sensor may have other voltage sensing applications.

Figure 1:
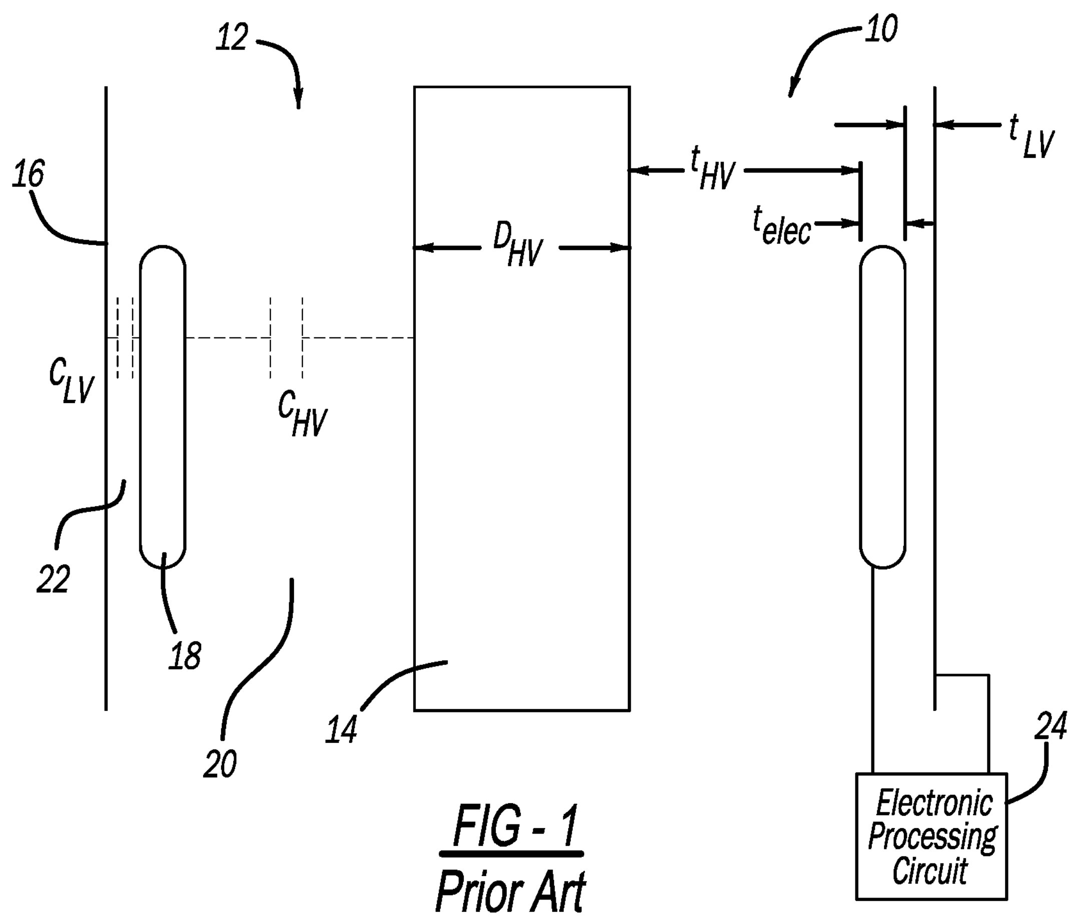
FIG. 1 is an illustration of a known capacitive voltage sensor molded in an insulation body.

FIG. 1 is a cross-sectional type illustration of a known capacitive voltage sensor 10 that includes a molded cylindrical insulation body 12, where the insulation body 12 can be a part of an insulation housing of a switch employed in switchgear. The insulation body 12 separates a central cylindrical high voltage conductor 14 at voltage $V_{hv}$ and an outer grounded layer 16 that may, for example, be painted by conductive paint on the insulation body 12, where the diameter the conductor 14 is denoted as $D_{HV}$. A sensing electrode 18 at voltage $V_{out}$ is molded within the insulation body 12 between the high voltage conductor 14 and the grounded layer 16, and is concentric with the high voltage conductor 14 and the grounded layer 16, where the sensing electrode 18 has an axial length $l_{axial}$ and a radial thickness $t_{elec}$. A uniform radial gap 20 with length $t_{HV}$ is provided between the sensing electrode 18 and the high voltage conductor 14, and a smaller uniform radial gap 22 having a length $t_{LV}$ is provided between the sensing electrode 18 and the outer grounded layer 16. The output voltage $V_{out}$ of the sensing electrode 18 is provided to an electronic processing circuit 24 to be used as desired.

The insulation body 12 creates a high voltage insulating layer 20 between the high voltage conductor 14 and the sensing electrode 18 having a capacitance $C_{HV}$, and creates a low voltage insulating layer 22 between the sensing electrode 18 and the grounded layer 16 and having a capacitance $C_{LV}$, where the capacitances $C_{HV}$ and $C_{LV}$ can be approximated as:

$$C_{HV} \approx \frac{2\pi\varepsilon l_{axial}}{\ln\frac{D_{HV}+2t_{HV}}{D_{HV}}}, \tag{1}$$

$$C_{LV} \approx \frac{2\pi\varepsilon l_{axial}}{\ln\frac{D_{HV}+2t_{HV}+2t_{elec}+2t_{LV}}{D_{HV}+2t_{HV}+2t_{elec}}}, \tag{2}$$

where ε is permittivity of the insulation body 12.

The capacitances $C_{HV}$ and $C_{LV}$ create a capacitive voltage divider having a voltage ratio R defined as:

$$R = \frac{C_{HV}+C_{LV}}{C_{HV}} = \frac{V_{hv}}{V_{out}}. \tag{3}$$

The output voltage $V_{out}$ of the voltage divider, i.e., the voltage between the sensing electrode 18 and the grounded layer 16, is given as:

$$V_{out} = \frac{V_{hv}}{R} = V_{hv}\frac{C_{HV}}{C_{HV}+C_{LV}}. \tag{4}$$

The electric field $E_{LV}$ in the low voltage insulating layer 22 is given approximately as:

$$E_{LV} \approx \frac{V_{out}}{t_{LV}}. \tag{5}$$

The electric field $E_{LV}$ can cause breakdown of the low voltage insulating layer 22 if there are defects in the layer 22 between the sensing electrode 18 and the grounded layer 16, and thus, it is desirable to keep the electric field $E_{LV}$ as low as practical. However, for the sensor 10, it is not possible to reduce the electric field $E_{LV}$ by changing the thickness $t_{LV}$ of the insulating layer 22. Specifically, if the thickness $t_{LV}$ of the insulating layer 22 is decreased without changing other parameters in the sensor 10, the capacitance $C_{LV}$ will increase, which increases the ratio R of the voltage divider, which produces a lower output voltage $V_{out}$. However, since the output voltage $V_{out}$ is divided using the smaller thickness $t_{LV}$ of the insulating layer 22, the electric field $E_{LV}$ will remain unchanged as can be seen in Table 1 below, which shows the capacitive voltage sensor parameters calculated by equations (1)-(5) when the thickness $t_{LV}$ of the insulating layer 22 is varied, where the other parameters are kept constant, for example, $D_{HV}$=1.25", $t_{HV}$=0.6", $t_{elec}$=0.2", $l_{axial}$=1.5", ε=4.5 and $V_{HV}$=60 kVrms. The calculated field values would not be too high themselves without defects in the low voltage insulating layer 22, but the problem is that molding defects are not infrequent because it is very hard to mold in such small gaps, such as <0.1", without defects.

TABLE 1

| | | | | |
|---|---|---|---|---|
| thickness of LV insulating gap $t_{lv}$[in] | 0.09 | 0.06 | 0.03 | 0.01 |
| $C_{HV}$ [pF] | 14.17 | 14.17 | 14.17 | 14.17 |
| $C_{LV}$ [pF] | 155.67 | 231.16 | 457.60 | 1363.31 |
| capacitive divider ratio R | 11.99 | 17.32 | 33.30 | 97.23 |
| sensing electrode voltage $V_{out}$ · [kV] | 5.01 | 3.46 | 1.80 | 0.62 |
| $E_{LV}$ · [$kV_{rms}$/mm] in LV gap | 2.26 | 2.32 | 2.39 | 2.44 |

It is also not possible to reduce the field in the low voltage insulating layer 22 by increasing the axial length $l_{axial}$ of the sensing electrode 18. That will indeed increase the capacitance $C_{LV}$ of the low voltage insulating layer 22, but it will also increase the capacitance $C_{HV}$ in the same proportion and the field in the low voltage insulating layer 22 will remain unchanged.

There are two possible general approaches to decrease the electric field $E_{LV}$ in the low voltage insulating layer 22. The first approach includes maintaining the capacitance $C_{HV}$ the same, but increasing the capacitance $C_{LV}$, where increasing the capacitance $C_{LV}$ has to be obtained without reducing the thickness $t_{LV}$ of the insulating layer 22. If the capacitance $C_{LV}$ is increased and the thickness $t_{LV}$ of the insulating layer 22 is unchanged, the voltage across the insulating layer 22 will be decreased, which decreases the electric field $E_{LV}$. This will eventually eliminate the possibility of breakdowns between the sensing electrode 18 and the grounded layer 16. At the same time the geometry of the high voltage insulating layer 20 is not changed in order to keep its dielectric strength and the capacitance $C_{HV}$ unchanged. The second approach includes decreasing the capacitance $C_{HV}$ while keeping the capacitance $C_{LV}$ the same, where the thickness $t_{HV}$ of the high voltage insulating layer 20 remains unchanged so as to not increase the overall diameter of the sensor 10. If the capacitance $C_{HV}$ is decreased and the capacitance $C_{LV}$ is unchanged, the voltage divider ratio R will be increased and the output voltage $V_{out}$ will decrease, which will give a lower electric field $E_{LV}$ in the low voltage insulating layer 22.

Figure 2:
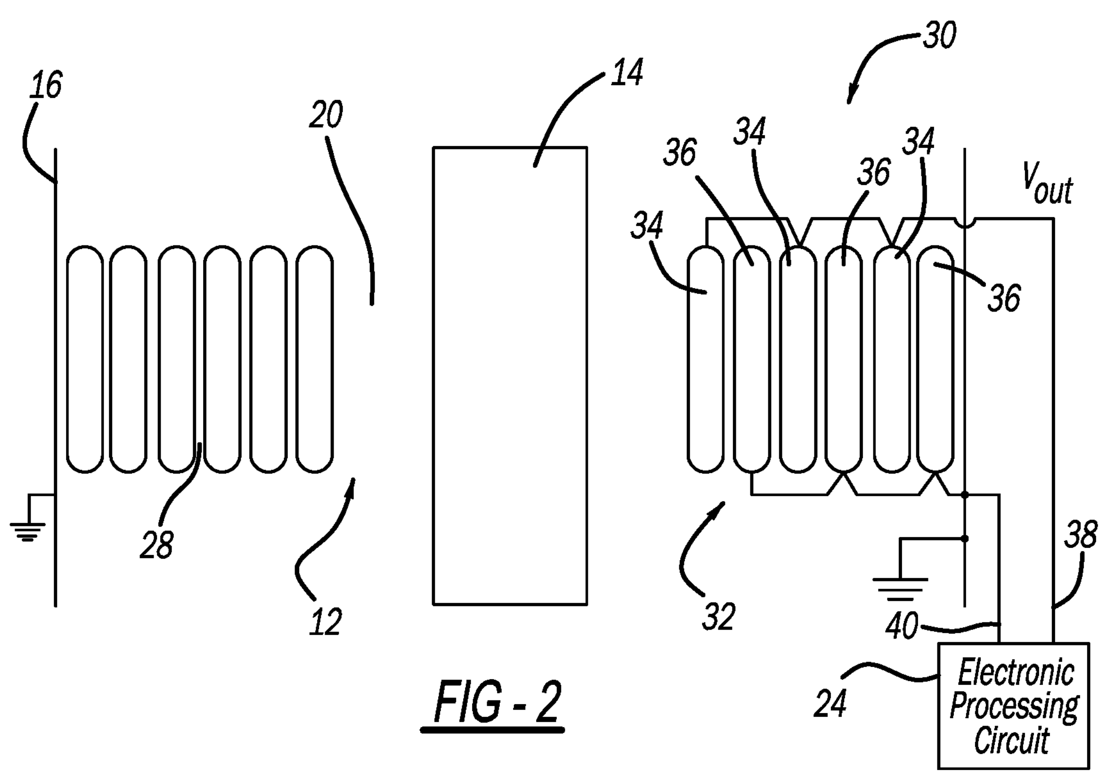
FIG. 2 is an illustration of a capacitive voltage sensor molded in an insulation body and including multiple electrode rings.

FIG. 2 is a cross-sectional type illustration of a capacitive voltage sensor 30 that is an illustration for the first approach, where like elements to the voltage sensor 10 are identified by the same reference number. The voltage sensor 30 includes an electrode assembly 32 having six ring electrodes rather than a single electrode. All of the electrodes have the same thickness $t_{elec}$ and the same length $l_{axial}$ as the sensing electrode 18 in the voltage sensor 10. Radial gaps 28 between adjacent ring electrodes are all the same and equal to the thickness $t_{LV}$ of the low voltage insulating layer 22 of the voltage sensor 10. The ring electrodes are connected electrically in two groups: an electrode 34 closest to the high voltage conductor 14 is connected to every second ring electrode and eventually to an input terminal 38 of the electronic processing circuit 24, while an electrode 36 second closest to the high voltage conductor 14 is also connected to every second ring electrode and then to a ground terminal 40. All of the electrodes 34 in the first group are referred to as sensing electrodes, and all of the electrodes 36 in the second group will be referred to as grounded electrodes. The capacitances between two adjacent electrodes 34 and 36 are approximately equal to the capacitance $C_{LV}$ of the sensor 10 because relevant geometrical parameters are kept the same. However, the total equivalent capacitance between the sensing electrodes 34 and the grounded electrodes 36 is five times the capacitance $C_{LV}$ because there are five low voltage insulating gaps 28 in parallel. At the same time, the capacitance of the high voltage insulating gap 20 remains the same as in the sensor 10 because its geometry is not changed. Finally, the ratio R of the voltage divider is increased approximately five times, which results in five times lower output voltage and five times lower field in any of the low voltage gaps 28.

The discussion above can be generalized for N ring electrodes. If N is an even number, the sensor 30 with N ring electrodes has N/2 sensing electrodes 34 and N/2 grounded electrodes 36, and there are N−1 low voltage insulating gaps between adjacent electrodes. The total capacitance $C_{LV,tot}$ between the sensing electrodes 34 and the grounded electrodes 36 is then:

$$C_{LV,tot}=(N-1)C_{LV}, \quad (6)$$

where C is the capacitance between adjacent ring electrodes.

If N is an odd number, then there are (N+1)/2 of the sensing electrodes 34 and (N−1)/2 of the grounded electrodes 36, but there is also the outer grounded layer 16 making capacitance with the last sensing electrode 34. In the end there are N low voltage gaps in this arrangement. The total capacitance $C_{LV,tot}$ between the sensing electrodes 34 and the grounded electrodes 36 is approximately:

$$C_{LV,tot}=NC_{LV}. \quad (7)$$

The output voltage $V'_{out}$ of the sensor 30 is approximately N times less than the output voltage $V_{out}$ of the sensor 10, as shown below.

$$\begin{aligned} V'_{out} &= V_{hv}\frac{C_{HV}}{C_{HV}+C_{LV,tot}}, \\ &\approx V_{hv}\frac{C_{HV}}{C_{LV,tot}}, \\ &= V_{hv}\frac{C_{HV}}{NC_{LV}}, \\ &= \frac{V_{out}}{N}. \end{aligned} \quad (8)$$

Because the sensor output voltage $V'_{out}$ is reduced, the field in the low voltage insulation layers is also reduced in the same proportion, and even if there are any voids between the sensing electrode 34 and the grounded electrodes 36, those will not lead to discharges and breakdown at normal operating voltage and during AC withstand testing.

Figure 3:
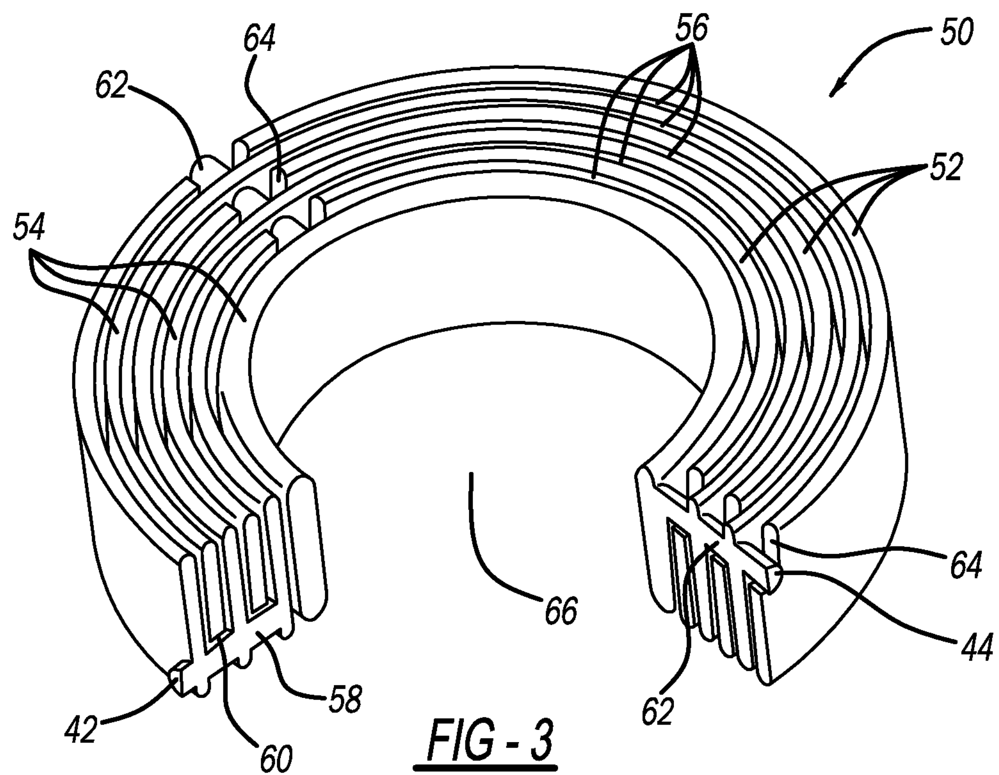
FIG. 3 is an isometric, cut-away view of an electrode assembly having sensing and ground ring electrodes for a capacitive voltage sensor.
Figure 4:
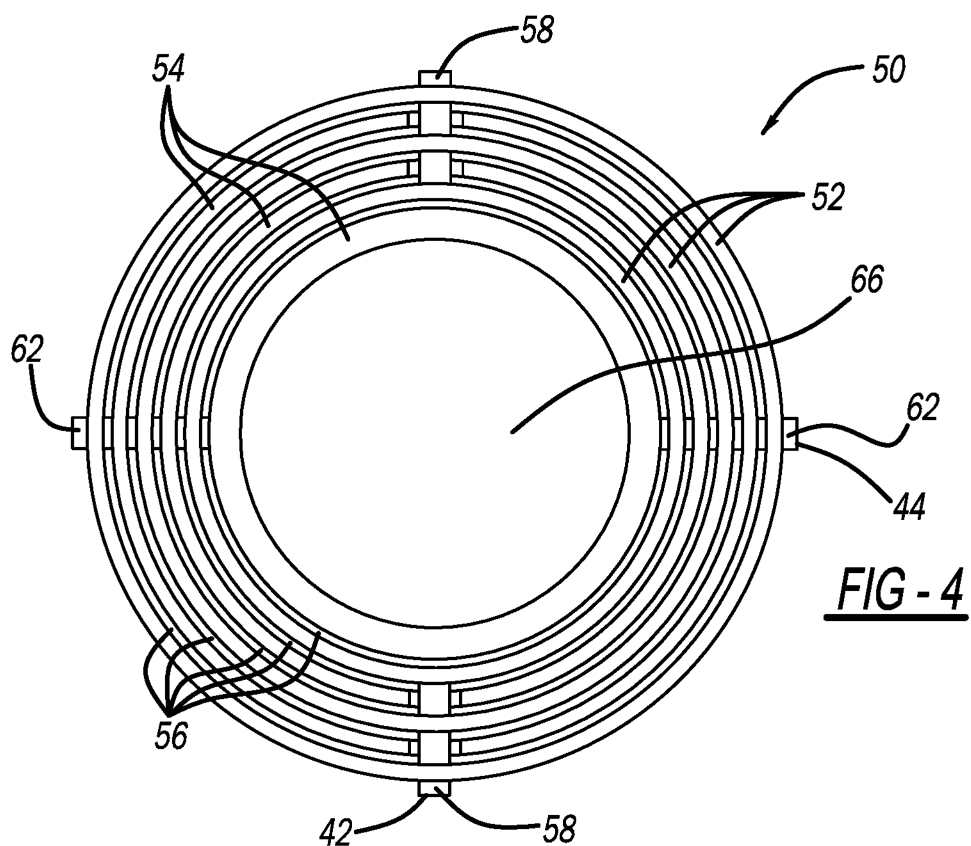
FIG. 4 is a top view of the electrode assembly shown in FIG. 3.

FIG. 3 is a cut-away isometric view and FIG. 4 is a top view of an annular electrode assembly 50 that can be used as the electrode assembly 32, where the high voltage conductor 14 is not shown, but it extends through a center area 66. The electrode assembly 50 includes three spaced apart grounded rings 52 having a desirable thickness and three spaced apart sensing rings 54 having the same thickness provided in an alternating sequence, where an annular space 56 is defined therebetween that will be filled with the molded body material to define the insulating layers. The grounded rings 52 are electrically coupled together by two cross conductors 58 on opposite sides of the grounded rings 52 extending through cut-out regions 60 in the sensing rings 54 and the sensing rings 54 are electrically coupled together by two cross conductors 62 on opposite sides of the sensing rings 54 extending through cut-out regions 64 in the grounded rings 52. The electrical connections to the electronic processing circuit 24 (not shown in FIGS. 3 and 4) are attached to ends 42 and 44 of the cross conductors 58 and 62, respectively. The grounded electrode rings 52 and the cross conductors 58 can be molded as a single part out of conductive plastic in a geometry as shown in FIGS. 3 and 4. The same applies to the sensing electrode rings 54 and the cross conductors 62.

Figure 5:
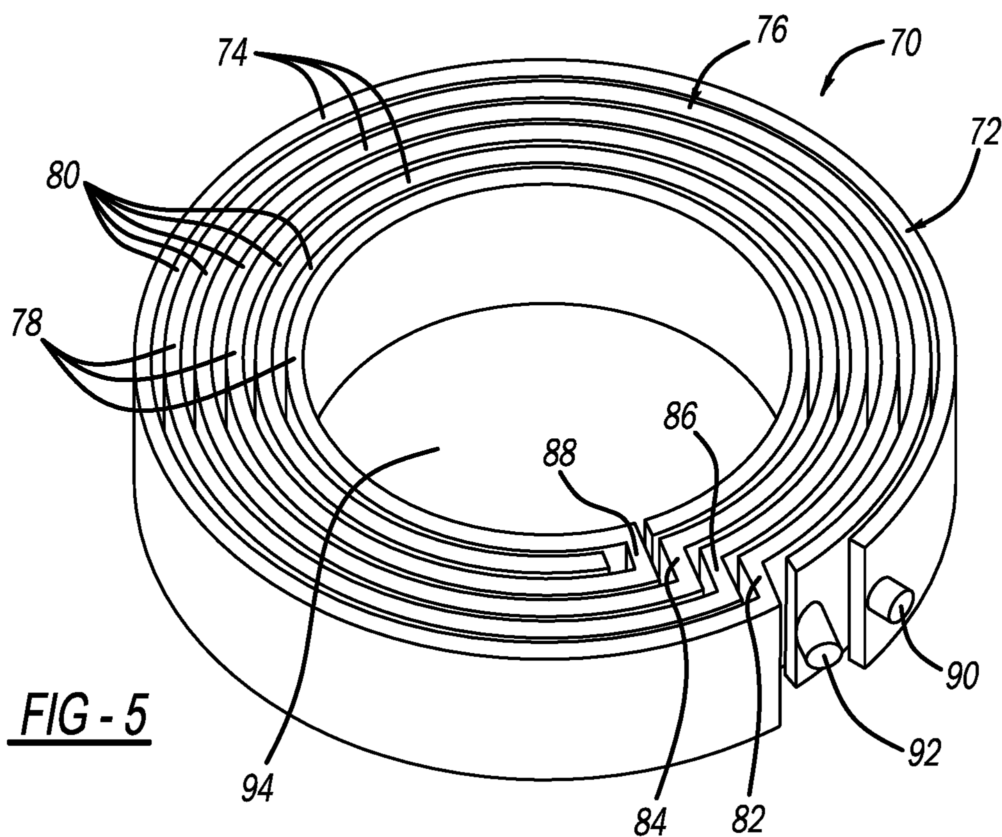
FIG. 5 is an isometric, cut-away view of another electrode assembly having sensing and ground ring electrodes for a capacitive voltage sensor.
Figure 6:
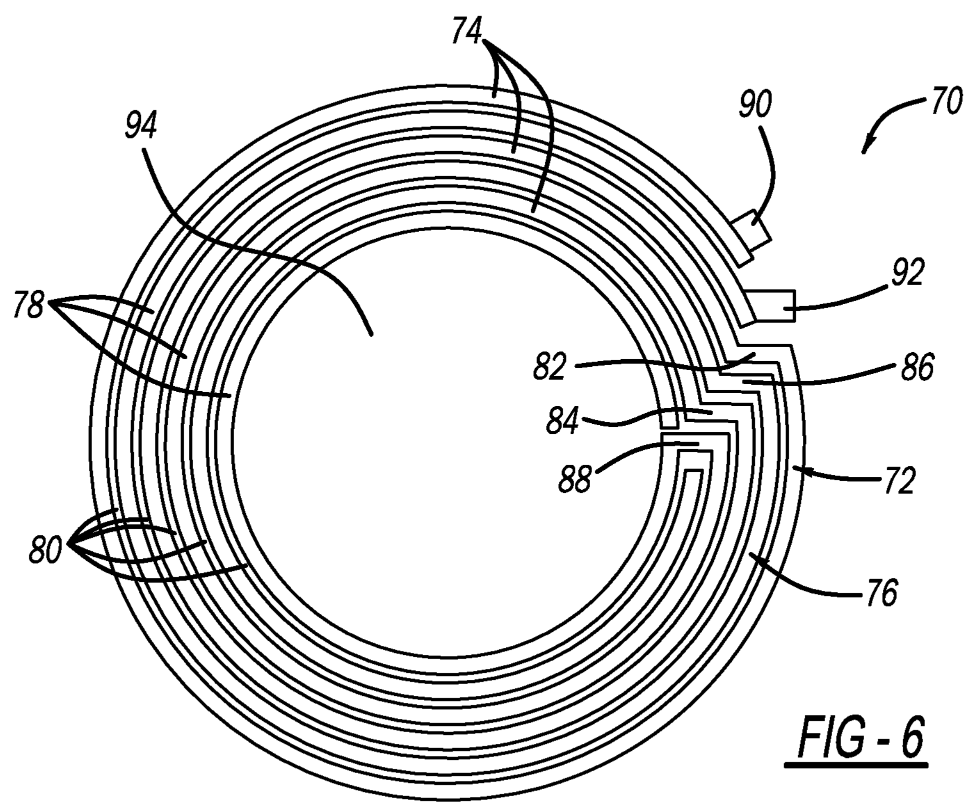
FIG. 6 is a top view of the electrode assembly shown in FIG. 5.

FIG. 5 is a cut-away isometric view and FIG. 6 is a top view of an annular electrode assembly 70 that can also be used as the electrode assembly 32, where the high voltage conductor 14 is not shown, but it extends through a center area 94. The assembly 70 includes a spiral grounded electrode 72 being wound to define three spaced apart ring sections 74 and a spiral sensing electrode 76 being wound to define three spaced apart ring sections 78, where an annular space 80 is defined therebetween that will be filled with the molded solid insulation body material to define the insulating layers. The grounded electrode 72 includes two straight sections 82 and 84 that connect the ring sections 74 and the sensing electrode 76 includes two straight sections 86 and 88 that connect sections 78. An electrical connector 90 is attached to the grounded electrode 72 and an electrical connector 92 is attached to the sensing electrode 76.

As mentioned, the capacitive voltage sensors 30, 50 and 70 discussed above describe sensors that embody the previously discussed first approach of how to reduce the electric field in the low voltage insulating gap of a capacitive voltage sensor. The following discussion of capacitive voltage sensors describes sensors that embody the previously discussed second approach.

Figure 7:
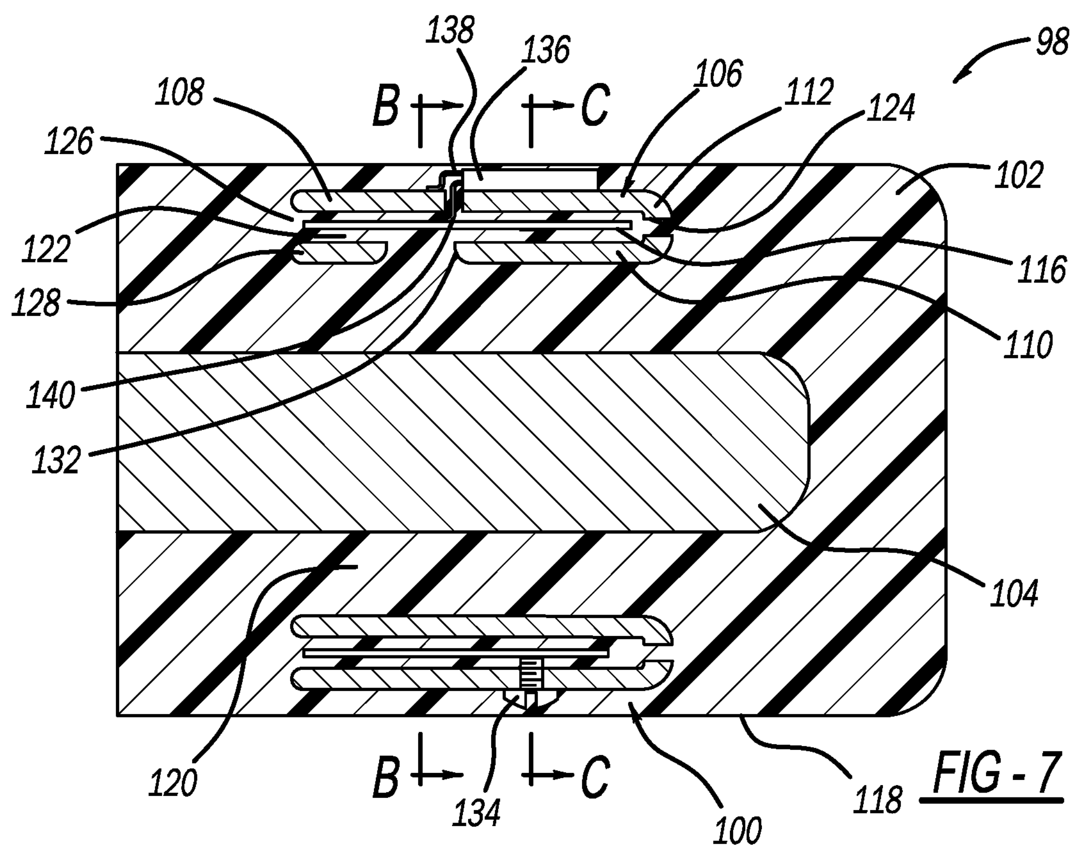
FIG. 7 is an axial cross-sectional view of a capacitive voltage sensor including a hidden sensing electrode.
Figure 8:
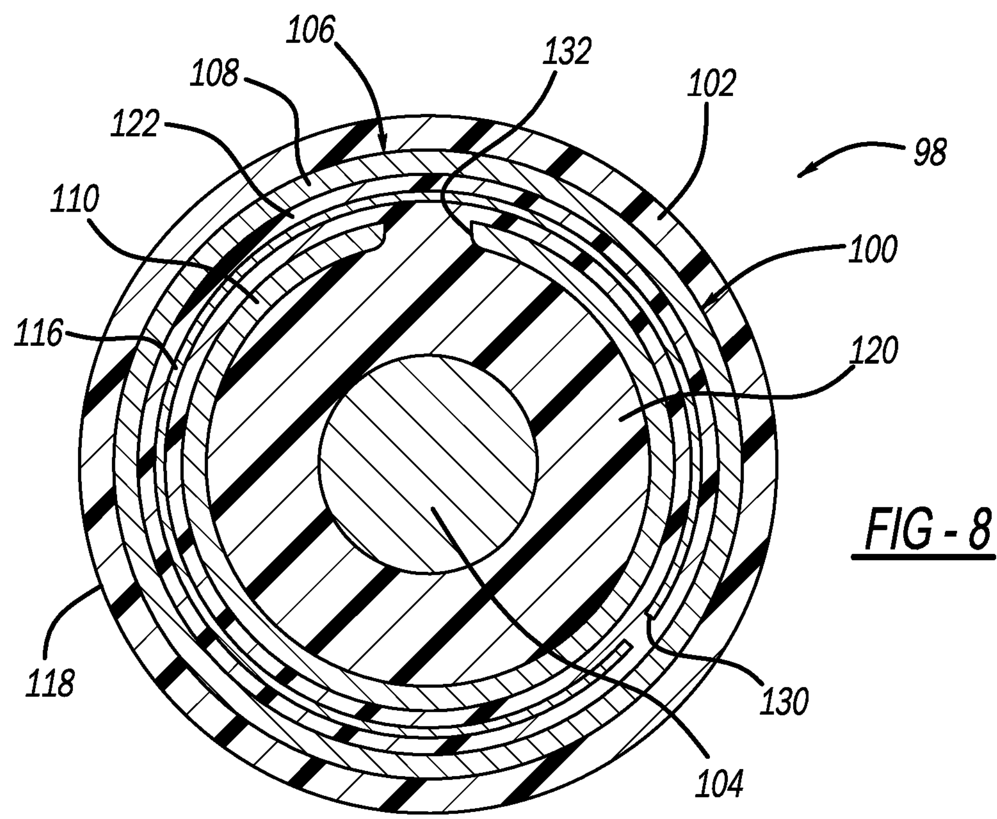
FIG. 8 is a radial cross-sectional view of the capacitive voltage sensor shown in FIG. 7 through line B-B.
Figure 9:
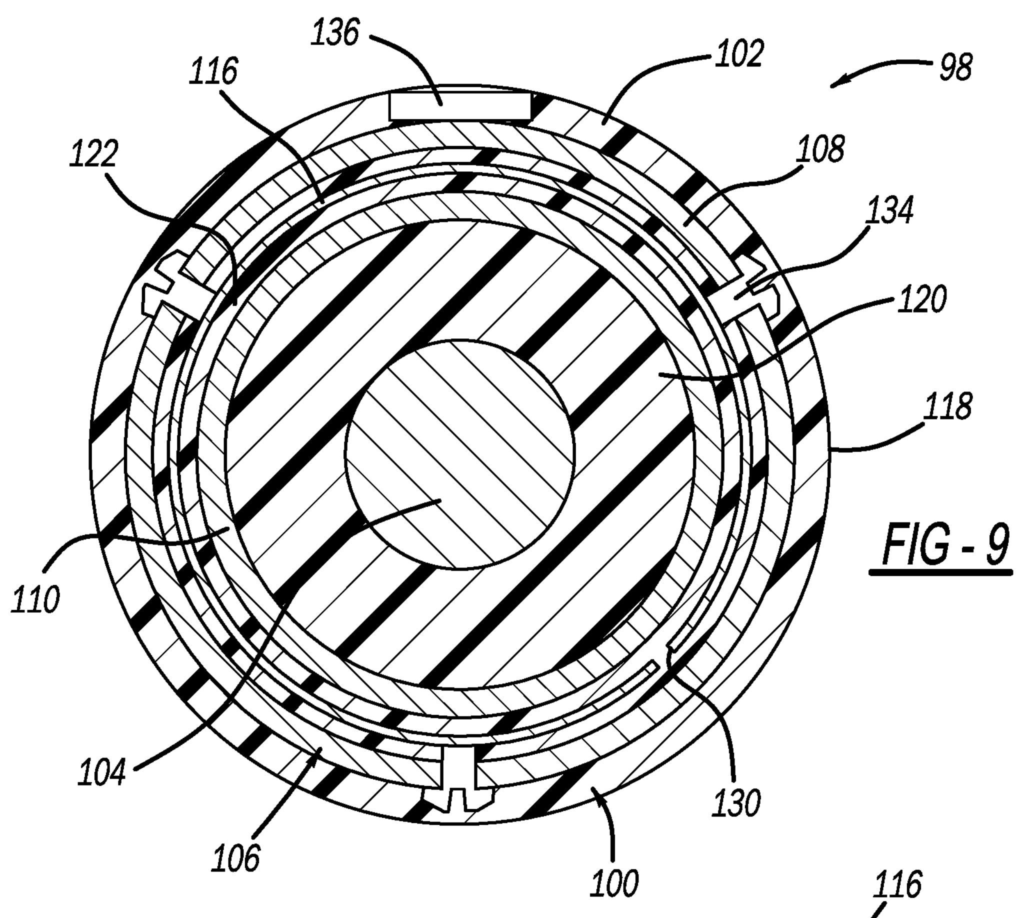
FIG. 9 is a radial cross-sectional view of the capacitive voltage sensor shown in FIG. 7 through line C-C.

FIG. 7 is an axial cross-sectional view, FIG. 8 is a radial cross-sectional view through line B-B in FIG. 7 and FIG. 9 is a radial cross-sectional view through line C-C in FIG. 7 of a capacitive voltage sensor 98. The sensor 98 includes a molded cylindrical insulation body 102 molded around an electrode assembly 100 and a central cylindrical high voltage conductor 104, where the insulation body 102 can be part of an insulation housing of a high voltage switch. The electrode assembly 100 includes a grounded electrode 106, where the electrode 106 can be made of a conductive polymer or metal. An insulating gap 120 of molded material between the grounded electrode 106 and the high voltage conductor 104 has a sufficient withstand voltage. The grounded electrode 106 is a single piece part including an outer ring 108 and an inner ring 110 defining a space 122 therebetween, where the rings 108 and 110 are joined together at one axial end 112 and a gap 126 is defined at an opposite axial end 128. Several holes or slots 124 are provided in the axial end 112 of the rings 108 and 110 that prevent trapping of air during molding of the insulation body 102. A single hole 132 with rounded edges is provided in the inner ring 110 of the grounded electrode 106. The hole 132 can be circular or any other suitable shape, such as elliptical. An outer surface 118 of the insulation body 102 may be coated with a conductive grounded layer (not shown), but the sensor 98 would not include such a layer for over-head applications.

Figure 10:
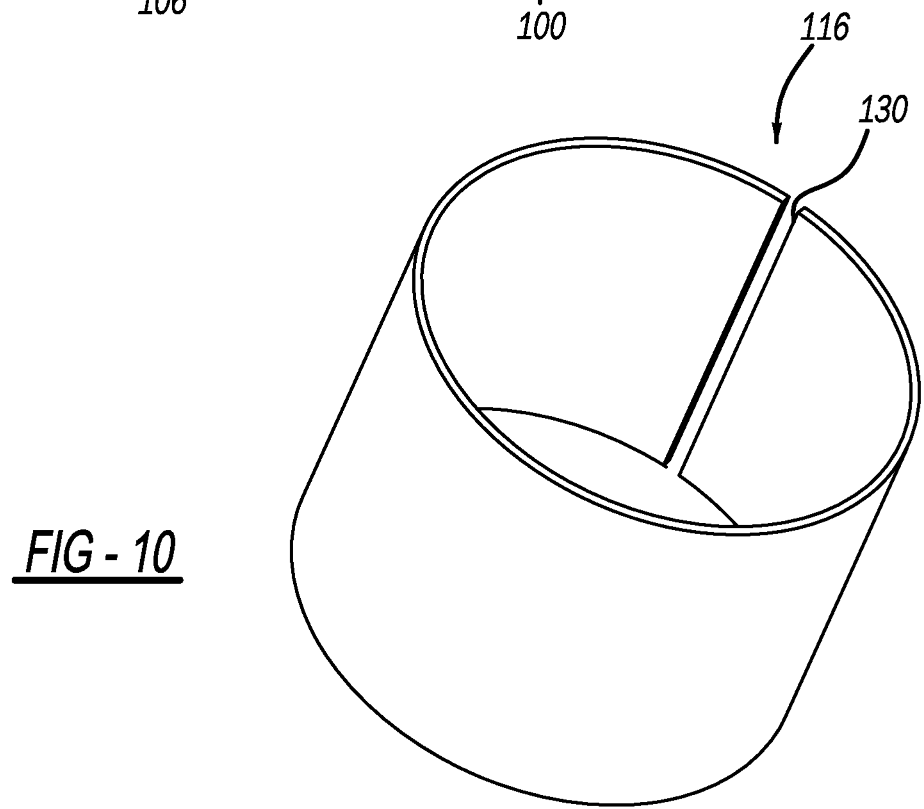
FIG. 10 is an isometric view of a hidden sensing electrode separated from the capacitive voltage sensor shown in FIG. 7.

The electrode assembly 100 also includes an annular hidden sensing electrode 116 that is molded within the insulation body 102 in the space 122 so that the electrode 116 is effectively completely surrounded by the grounded electrode 106. FIG. 10 is an isometric view of the sensing electrode 116 of the sensor 98 and may or may not include a slot 130, where the slot 130 extends the full axial length of the electrode 116, and where the sensing electrode 116 is made of a metal sheet or of conductive polymer. The position of the sensing electrode 116 with respect to the grounded electrode 106 is fixed by three or more insulating screws 134, where custom-made insulating spacers may be used instead of the screws 134. The outer ring 108 of the grounded electrode 106 is electrically connected to an electronic processing circuit 136 by a wire lead 138, where the lead 138 is fixed to the ring 108 by a screw or a conductive adhesive, and the sensing electrode 116 is electrically connected to the processing circuit 136 by a wire lead 140, where the lead 140 is fixed to the electrode 116 by solder or a conductive adhesive.

The sensing electrode 116 is capacitively coupled to the high voltage conductor 104 through the hole 132, where the capacitance $C_{HV}$ between the sensing electrode 116 and the high voltage conductor 104 is approximately directly proportional to the area of the hole 132. The capacitance $C_{LV}$ between the sensing electrode 116 and the grounded electrode 106 is the sum of capacitances between the sensing electrode 116 and the rings 108 and 110. The capacitances $C_{HV}$ and $C_{LV}$ effectively create a capacitive voltage divider that attenuates voltage of the high voltage conductor 104 to the voltage of the sensing electrode 116. The main advantage is that any specified divider ratio R can be obtained by designing an appropriate diameter, i.e., area, of the hole 132. By making the diameter of the hole 132 smaller, the capacitance $C_{HV}$ gets smaller and the divide ratio $R=(C_{HV}+C_{LV})/C_{HV}$ gets higher. Thus, it is quite simple to get capacitive divider ratio R in the range of 1000-10000 that was not possible in the prior art represented by the voltage sensor 10. The consequence of the high value of the capacitive divider ratio R is that the voltage of the sensing electrode 116 is quite low (<100V) under all conditions (including BIL) as there is not sufficient voltage on the sensing electrode 116 to break down gaps between the sensing electrode 116 and the rings 108 and 110, even if there are defects (like air inclusions) in those gaps. In other words, this geometry is immune to defects between the sensing electrode 116 and the grounded electrode 106, which is a big improvement compared with the prior art.

Figure 11:
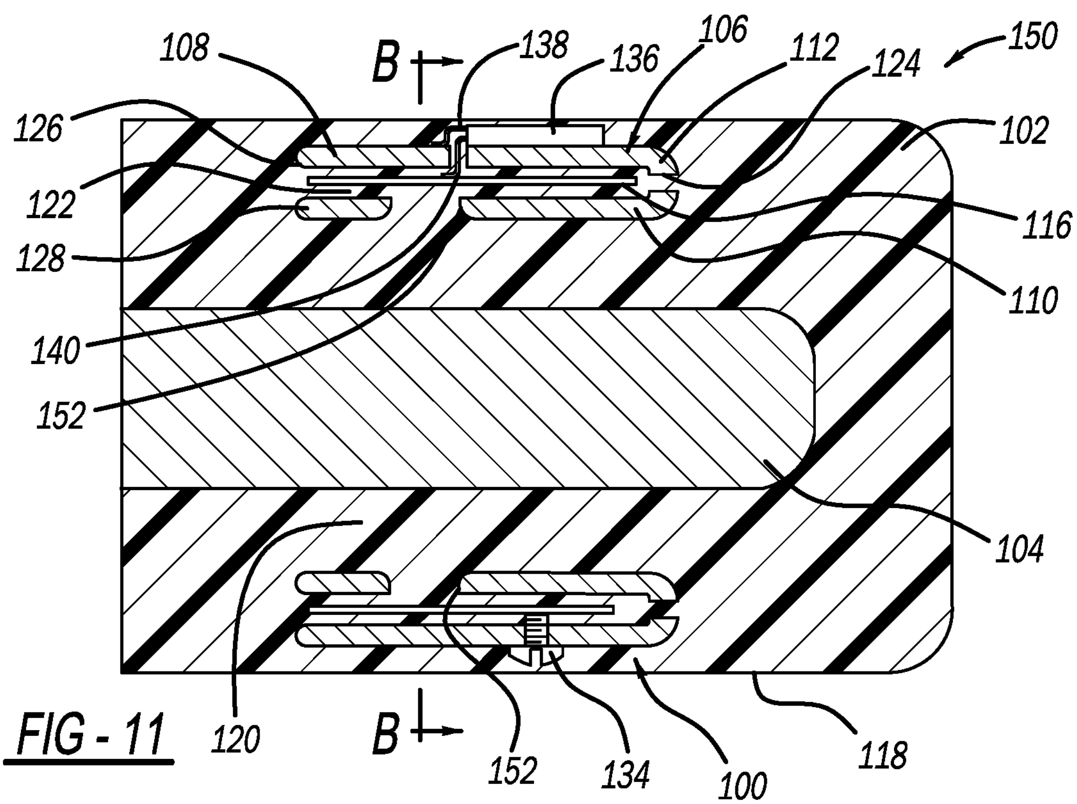
FIG. 11 is an axial cross-sectional view of a capacitive voltage sensor including a hidden sensing electrode and multiple holes.
Figure 12:
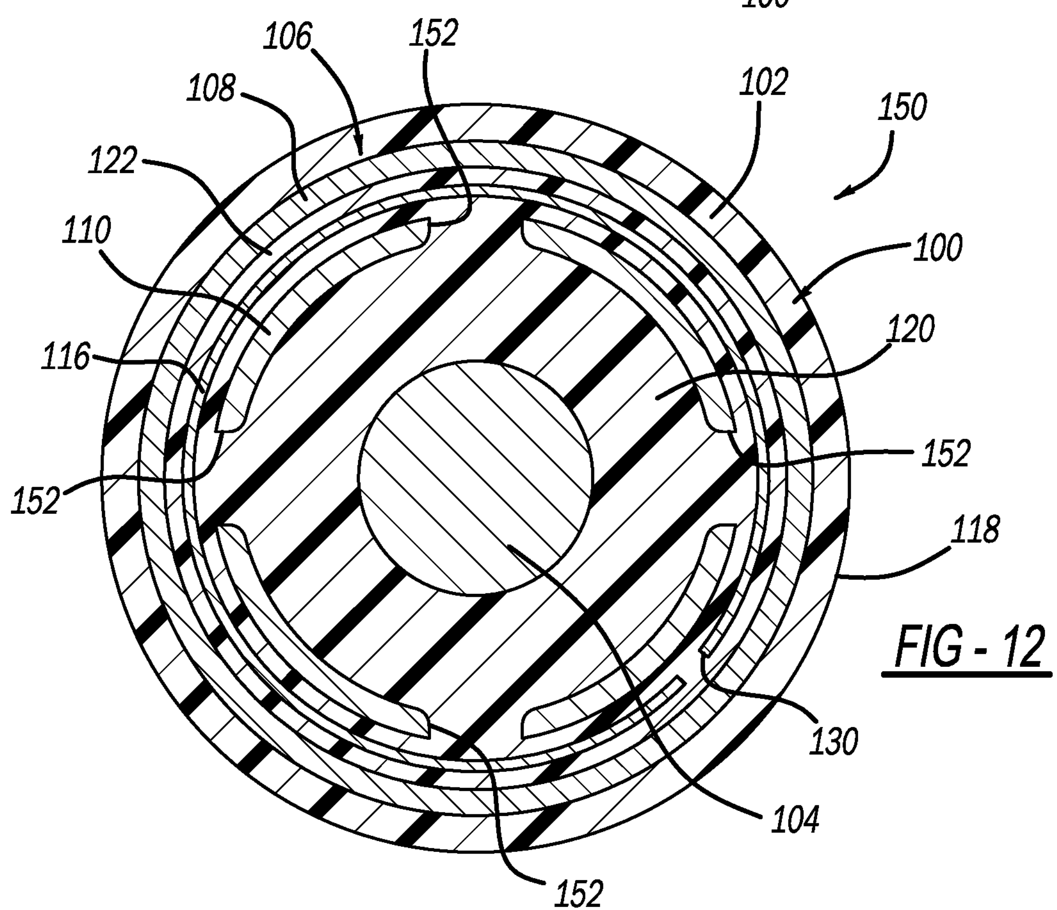
FIG. 12 is a radial cross-sectional view of the capacitive voltage sensor shown in FIG. 11 through line B-B.

FIG. 11 is an axial cross-sectional view and FIG. 12 is a radial cross-sectional view through line B-B in FIG. 11 of a capacitive voltage sensor 150 similar to the voltage sensor 98, where like elements are identified by the same reference number. Particularly, the only difference between the sensors 98 and 150 is that the sensor 150 includes four holes 152 symmetrically disposed in the inner ring 110 of the grounded electrode 106. This is to illustrate that capacitive coupling between the high voltage conductor 104 and the sensing electrode 116 can be effected through a plurality of holes in the inner ground ring 110.

FIG. 13 is an isometric view of the electrode assembly 100 separated from the sensor 98 and FIG. 14 is an isometric view of an electrode assembly 160 that can replace the electrode assembly 100, where like elements are identified by the same reference number. Particularly, the only difference between the electrode assembly 100 and the electrode assembly 160 is that the inner ring 110 of the grounded electrode 106 includes a slot 162 instead of the hole 132, where the capacitive coupling between the sensing electrode 116 and the inner conductor 104 is the same.

Figure 15:
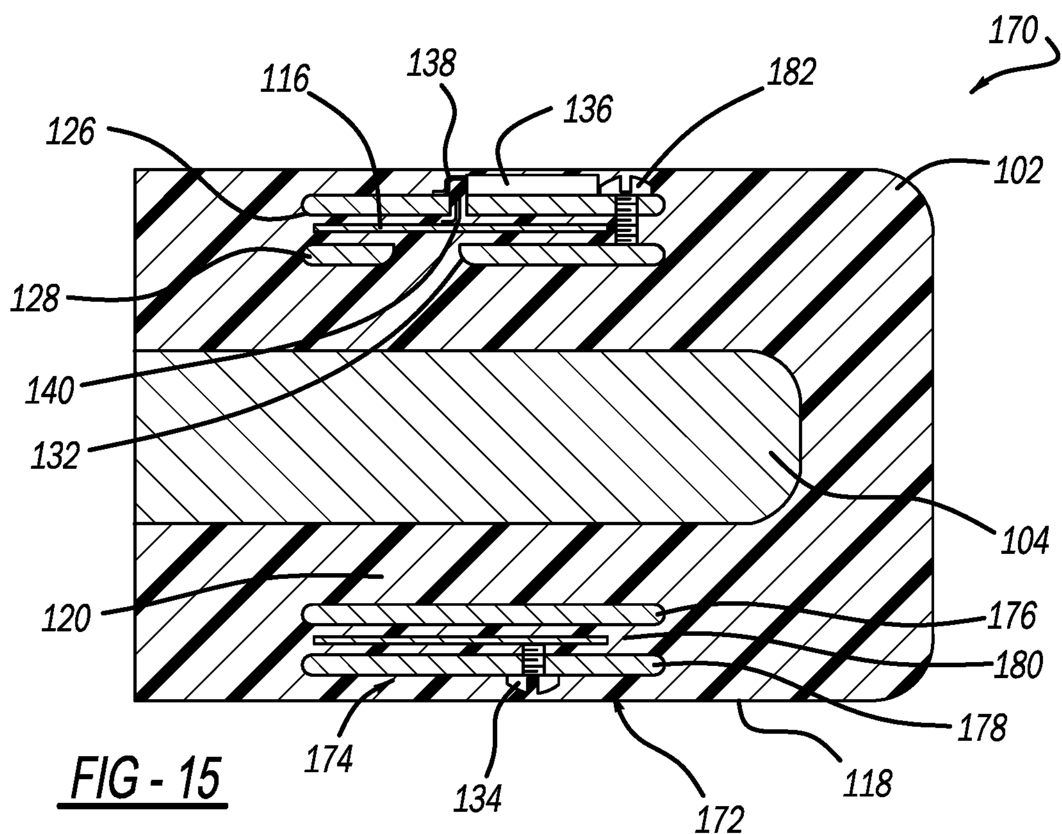
FIG. 15 is an axial cross-sectional view of a capacitive voltage sensor including a hidden sensing electrode, where the inner and outer grounded electrodes are separate parts connected by conductive screws.
Figure 16:
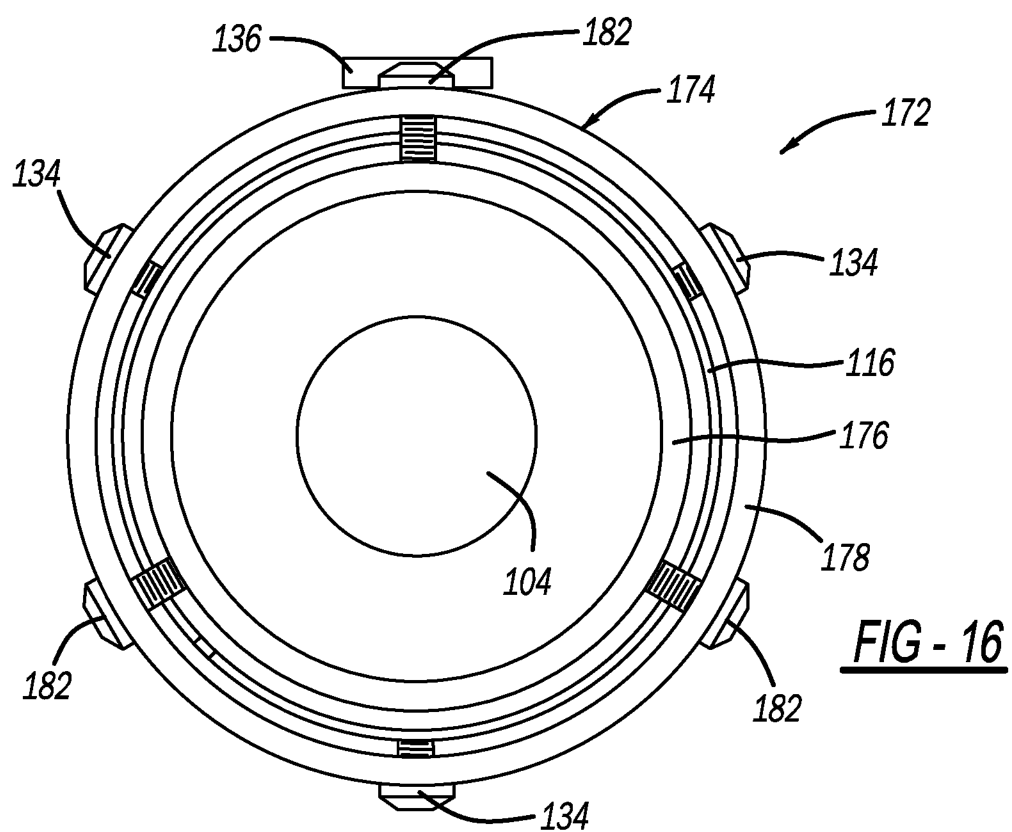
FIG. 16 is a top view of an electrode assembly separated from the capacitive voltage sensor shown in FIG. 15.

FIG. 15 is an axial cross-sectional view of a capacitive voltage sensor 170 similar to the voltage sensor 98, where like elements are identified by the same reference number. Particularly, the only difference between the sensors 98 and 170 is that the electrode assembly 100 is replaced with an electrode assembly 172 including a grounded electrode 174 having an inner ring 176 and an outer ring 178 that are spaced apart defining a gap 180 therebetween, where the sensing electrode 116 is provided in the gap 180. FIG. 16 is a top view of the electrode assembly 172 removed from the sensor 170. Thus, instead of the rings 176 and 178 being connected at a common end like the rings 108 and 110 they are electrically coupled together by three conductive screws 182.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A capacitive voltage sensor comprising:

an annular electrode assembly including a grounded electrode having an inner ring and an outer ring defining a space therebetween, and a sensing electrode positioned in the space and being substantially surrounded by the inner and outer rings, said inner ring including at least one opening;

a cylindrical center conductor extending through the electrode assembly; and a molded insulating body formed around the electrode assembly and the center conductor.

2. The sensor according to claim 1 wherein the at least one opening in the inner ring is one of a single circular opening and a plurality of circumferentially and symmetrically disposed circular openings.

3. The sensor according to claim 2 wherein when the at least one opening is a plurality of circumferentially and symmetrically disposed circular openings, the plurality of circumferentially disposed circular openings in the inner ring of the grounded electrode is selected to provide adequate capacitive coupling between the sensing electrode and the high voltage conductor in order to have a desired voltage ratio of the capacitive voltage sensor.

4. The sensor according to claim 1 wherein the at least one opening in the inner ring of the grounded electrode is an axial slot configured to control capacitive coupling between the sensing electrode and the high voltage electrode.

5. The sensor according to claim 1 wherein the grounded electrode is a single piece part where the inner and outer rings are attached at one end and are open at an opposite end.

6. The sensor according to claim 5 wherein openings are formed in the one end of the inner and outer rings of the grounded electrode.

7. The sensor according to claim 1 wherein the inner and outer rings of the grounded electrode are separate elements and are electrically coupled.

8. The sensor according to claim 1 wherein an outside surface of the molded insulating body has a conductive ground layer.

9. The sensor according to claim 8 wherein the molded insulating body is a part of a switch.

10. The sensor according to claim 9 wherein the switch is a part of switchgear in a medium voltage network.

11. A capacitive voltage sensor comprising:

an electrode assembly including a plurality of spaced apart grounded electrodes and a plurality of spaced apart sensing electrodes where the grounded electrodes and the sensing electrodes are configured in an alternating pattern and where the grounded electrodes are electrically coupled together and the sensing electrodes are electrically coupled together;

a center conductor extending through the electrode assembly; and a plurality of insulating layers provided between the grounded electrodes and the sensing electrodes by molding of an insulating housing.

12. The sensor according to claim 11 wherein the plurality of grounded electrodes are a plurality of grounded rings that are electrically coupled by at least one ground connector bar extending through cut-out sections in the sensing electrodes and the plurality of sensing electrodes are a plurality of sensing rings that are electrically coupled by at least one sensing connector bar extending through cut-out sections in the grounded electrodes.

13. The sensor according to claim 12 wherein the at least one ground connector bar is two ground connector bars on opposite sides of the electrode assembly and the at least one sensing connector bar is two sensing connector bars on opposite sides of the electrode assembly.

14. The sensor according to claim 11 wherein the plurality of grounded electrodes are part of a single circularly wound grounded electrode having ground ring sections and the plurality of sensing electrodes are part of a single circularly wound sensing electrode having sensing ring sections.

15. The sensor according to claim 11 wherein the plurality of grounded electrodes is three grounded electrodes and the plurality of sensing electrodes is three sensing electrodes.

16. The sensor according to claim 11 wherein the plurality of insulating layers are part of a molded body and wherein the electrode assembly is molded into the molded body.

17. The sensor according to claim 16 wherein an outside surface of the molded body has a conductive grounded layer.

18. The sensor according to claim 17 wherein the molded body is part of a switch.

19. The sensor according to claim 18 wherein the switch is part of switchgear in a medium voltage network.

20. The sensor according to claim 11 wherein a distance between each of the electrodes to an adjacent electrode is the same.

* * * * *